(12) United States Patent
Zhang et al.

(10) Patent No.: US 11,239,445 B2
(45) Date of Patent: Feb. 1, 2022

(54) DISPLAY SUBSTRATE WITH POWER PAD IN PERIPHERAL AREA AND METHOD OF MANUFACTURING THEREOF

(71) Applicant: BOE Technology Group Co., Ltd., Beijing (CN)

(72) Inventors: Song Zhang, Beijing (CN); Ling Shi, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 72 days.

(21) Appl. No.: 16/639,112

(22) PCT Filed: Mar. 11, 2019

(86) PCT No.: PCT/CN2019/077691
§ 371 (c)(1),
(2) Date: Feb. 13, 2020

(87) PCT Pub. No.: WO2020/181467
PCT Pub. Date: Sep. 17, 2020

(65) Prior Publication Data
US 2021/0135153 A1    May 6, 2021

(51) Int. Cl.
H01L 51/52 (2006.01)
H01L 27/32 (2006.01)
H01L 51/56 (2006.01)

(52) U.S. Cl.
CPC ...... *H01L 51/5253* (2013.01); *H01L 27/3246* (2013.01); *H01L 27/3258* (2013.01);
(Continued)

(58) Field of Classification Search
CPC . H01L 51/5253; H01L 51/56; H01L 27/3246; H01L 27/3258; H01L 27/3276; H01L 2227/323
See application file for complete search history.

(56) References Cited

U.S. PATENT DOCUMENTS

2015/0221707 A1   8/2015  Go
2017/0033312 A1   2/2017  Kim et al.
(Continued)

FOREIGN PATENT DOCUMENTS

CN   104821325 A   8/2015
CN   106409869 A   2/2017
(Continued)

OTHER PUBLICATIONS

International Search Report & Written Opinion dated Dec. 10, 2019, regarding PCT/CN2019/077691.

*Primary Examiner* — Lex H Malsawma
(74) *Attorney, Agent, or Firm* — Intellectual Valley Law, P.C.

(57) ABSTRACT

A display substrate having a display area and a peripheral area. The display panel includes a base substrate; a first power pad on the base substrate, the first power pad including a first portion in the peripheral area and along a power line interface side of the display substrate; a planarization layer on a side of the first power pad away from the base substrate; a pixel definition layer on a side of the planarization layer away from the base substrate, defining a plurality of subpixel apertures; and an encapsulating layer on a side of the pixel definition layer away from the base substrate. The display substrate includes a first groove extending through one or a combination of the planarization layer and the pixel definition layer, exposing a surface of the first portion of the first power pad in the peripheral area.

20 Claims, 9 Drawing Sheets

(52) U.S. Cl.
CPC .......... *H01L 27/3276* (2013.01); *H01L 51/56* (2013.01); *H01L 2227/323* (2013.01)

(56) References Cited

U.S. PATENT DOCUMENTS

| | | | |
|---|---|---|---|
| 2017/0162637 A1* | 6/2017 | Choi | ........................ G09G 3/20 |
| 2017/0365814 A1 | 12/2017 | Kim et al. | |
| 2018/0145127 A1* | 5/2018 | Shin | .................... H01L 27/3279 |

FOREIGN PATENT DOCUMENTS

| | | |
|---|---|---|
| CN | 108091634 A | 5/2018 |
| CN | 108258146 A | 7/2018 |

\* cited by examiner

DISPLAY SUBSTRATE WITH POWER PAD IN PERIPHERAL AREA AND METHOD OF MANUFACTURING THEREOF

CROSS-REFERENCE TO RELATED APPLICATION

This application is a national stage application under 35 U.S.C. § 371 of International Application No. PCT/CN2019/077691, filed Mar. 11, 2019, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatuses.

SUMMARY

In one aspect, the present invention provides a display substrate having a display area and a peripheral area, comprising a base substrate; a first power pad on the base substrate, the first power pad comprising a first portion in the peripheral area and along a power line interface side of the display substrate; a planarization layer on a side of the first power pad away from the base substrate; a pixel definition layer on a side of the planarization layer away from the base substrate, defining a plurality of subpixel apertures; and an encapsulating layer on a side of the pixel definition layer away from the base substrate; wherein the display substrate comprises a first groove extending through one or a combination of the planarization layer and the pixel definition layer, exposing a surface of the first portion of the first power pad in the peripheral area; and the encapsulating layer extends into the first groove and is in direct contact with the surface of the first portion, thereby encapsulating the display substrate.

Optionally, the encapsulating layer completely covers the surface of the first portion.

Optionally, the first portion comprises a first side away from the base substrate, a second side opposite to the first side and closer to the base substrate, a third side connecting the first side and the second side and closer to the display area, and a fourth side connecting the first side and the second side, the fourth side being opposite to the third side and away from the display area the fourth side of the first portion is covered by one or a combination of the pixel definition layer and the planarization layer; and the first groove exposes a portion of the first side.

Optionally, the fourth side has a concave surface.

Optionally, the first portion comprises at least one sublayer that is over-etched on the fourth side, thereby forming the concave surface.

Optionally, the encapsulating layer comprises a first inorganic encapsulating sub-layer, the first inorganic encapsulating sub-layer extending into the first groove and being in direct contact with the surface of the first portion.

Optionally, in a region corresponding to the first groove, the encapsulating layer further comprises an organic encapsulating sub-layer on a side of the first inorganic encapsulating sub-layer away from the base substrate, and a second inorganic encapsulating sub-layer on a side of the organic encapsulating sub-layer away from the first inorganic encapsulating sub-layer.

Optionally, the first power pad further comprises at least one second portion connected to the first portion and extending from the first portion away from the display area; and the at least one second portion is at least partially covered by one or a combination of the pixel definition layer and the planarization layer.

Optionally, the display substrate further comprises a second groove extending through one or a combination of the planarization layer and the pixel definition layer, exposing a surface of the at least one second portion of the first power pad in the peripheral area; and the encapsulating layer extends into the second groove and is in direct contact with the surface of the at least one second portion.

Optionally, the encapsulating layer comprises a first inorganic encapsulating sub-layer, the first inorganic encapsulating sub-layer extending into the second groove and being in direct contact with the surface of the at least one second portion.

Optionally, in a region corresponding to the second groove, the encapsulating layer further comprises an organic encapsulating sub-layer on a side of the first inorganic encapsulating sub-layer away from the base substrate, and a second inorganic encapsulating sub-layer on a side of the organic encapsulating sub-layer away from the first inorganic encapsulating sub-layer.

Optionally, the at least one second portion comprises two second portions connected to the first portion respectively at different locations and extending from the first portion away from the display area; and the first portion and the two second portions form a pi-shaped structure.

Optionally, the display substrate further comprises a second power pad on the base substrate and in the peripheral area, the second power pad spaced apart from the first power pad; wherein the second power pad comprises at least one third portion on the power line interface side of the display substrate, the at least one third portion at least partially covered by one or a combination of the pixel definition layer and the planarization layer; the second groove extends through one or a combination of the planarization layer and the pixel definition layer, further exposing a surface of the at least one third portion of the second power pad in the peripheral area; and the encapsulating layer extends into the second groove and is in direct contact with the surface of the at least one third portion.

Optionally, the display substrate further comprises a second power pad on the base substrate and in the peripheral area, the second power pad spaced apart from the first power pad; wherein the second power pad comprises at least one third portion on the power line interface side of the display substrate, the at least one third portion at least partially covered by one or a combination of the pixel definition layer and the planarization layer; the at least one third portion is on a side of the first portion extending away from the display area, the first portion and a respective one of the at least one third portion being spaced apart by a first gap; and the first groove is on a side of the first gap closer to the display area.

Optionally, the planarization layer at least extends into the first gap.

Optionally, the first power pad further comprises at least one second portion connected to the first portion and extending from the first portion away from the display area; the at least one second portion is at least partially covered by one or a combination of the pixel definition layer and the planarization layer; and the at least one second portion and the at least one third portion are on a side of the first portion extending away from the display area, a respective one of the at least one second portion being spaced apart from a respective one of the at least one third portion by a second gap connected to the first gap.

Optionally, the planarization layer extends into the first gap and the second gap.

Optionally, the display substrate further comprises a third groove extending through one or a combination of the planarization layer and the pixel definition layer, exposing a surface of the at least one second portion of the first power pad in the peripheral area; the encapsulating layer comprises a first inorganic encapsulating sub-layer, the first inorganic encapsulating sub-layer extending into the third groove and being in direct contact with the surface of the at least one second portion; in a region corresponding to the third groove, the encapsulating layer further comprises a second inorganic encapsulating sub-layer on a side of the first inorganic encapsulating sub-layer away from the base substrate, the second inorganic encapsulating sub-layer being in direct contact with the first inorganic encapsulating sub-layer.

Optionally, the first power pad is selected from a group consisting of a VDD power pad connected to a plurality of VDD high voltage power lines and a VSS power pad connected to a plurality of VSS low voltage power lines.

In another aspect, the present invention provides a display apparatus, comprising the display substrate described herein or fabricated by a method described herein, and one or more integrated circuits connected to the display substrate.

In another aspect, the present invention provides a method of fabricating a display substrate, comprising forming a first power pad on a base substrate, the first power pad formed to comprise a first portion in the peripheral area and along a power line interface side of the display substrate; forming a planarization layer on a side of the first power pad away from the base substrate; forming a pixel definition layer on a side of the planarization layer away from the base substrate, defining a plurality of subpixel apertures; forming a first groove extending through one or a combination of the planarization layer and the pixel definition layer, exposing a surface of the first portion of the first power pad in the peripheral area; and forming an encapsulating layer on a side of the pixel definition layer away from the base substrate, the encapsulating layer formed to extend into the first groove and be in direct contact with the surface of the first portion, thereby encapsulating the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
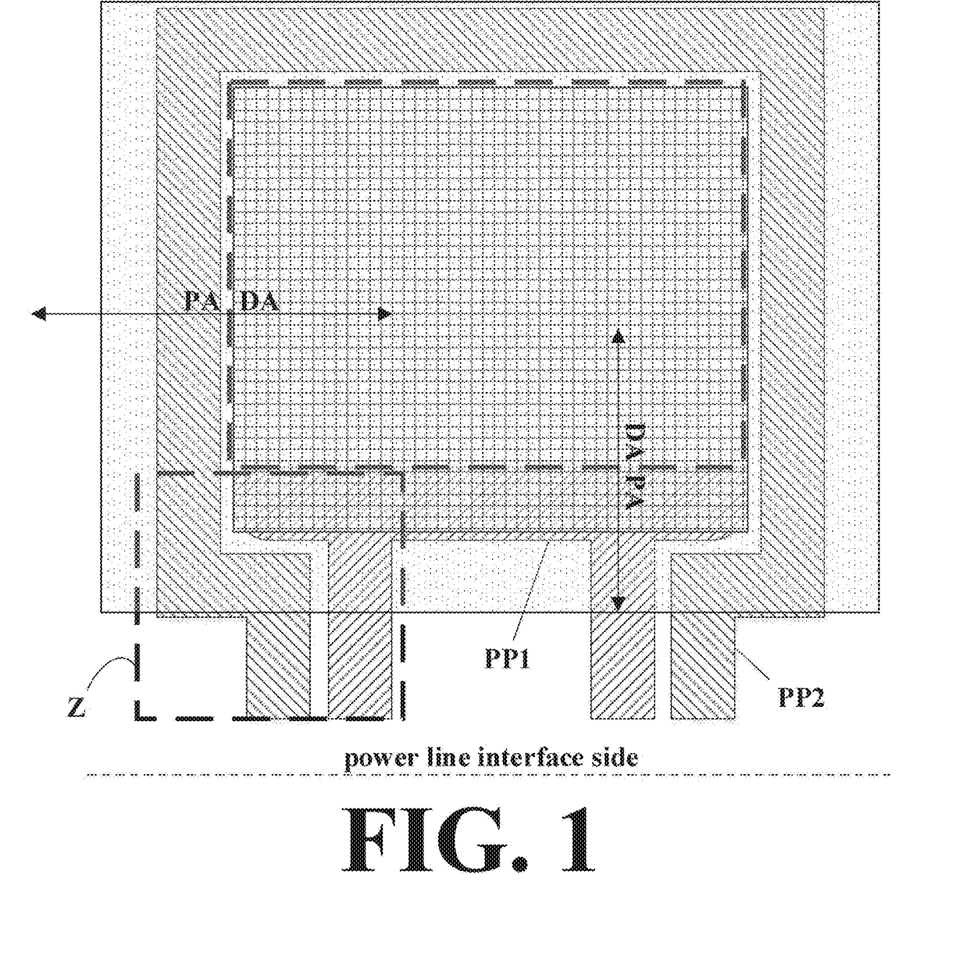
FIG. 1 is a plan view of a display substrate in some embodiments according to the present disclosure.
Figure 2:
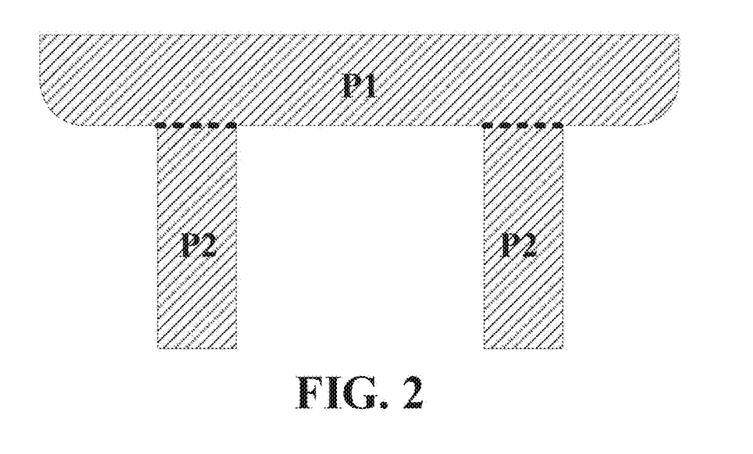
FIG. 2 is schematic diagram illustrating the structure of a first power pad in some embodiments according to the present disclosure.
Figure 3:
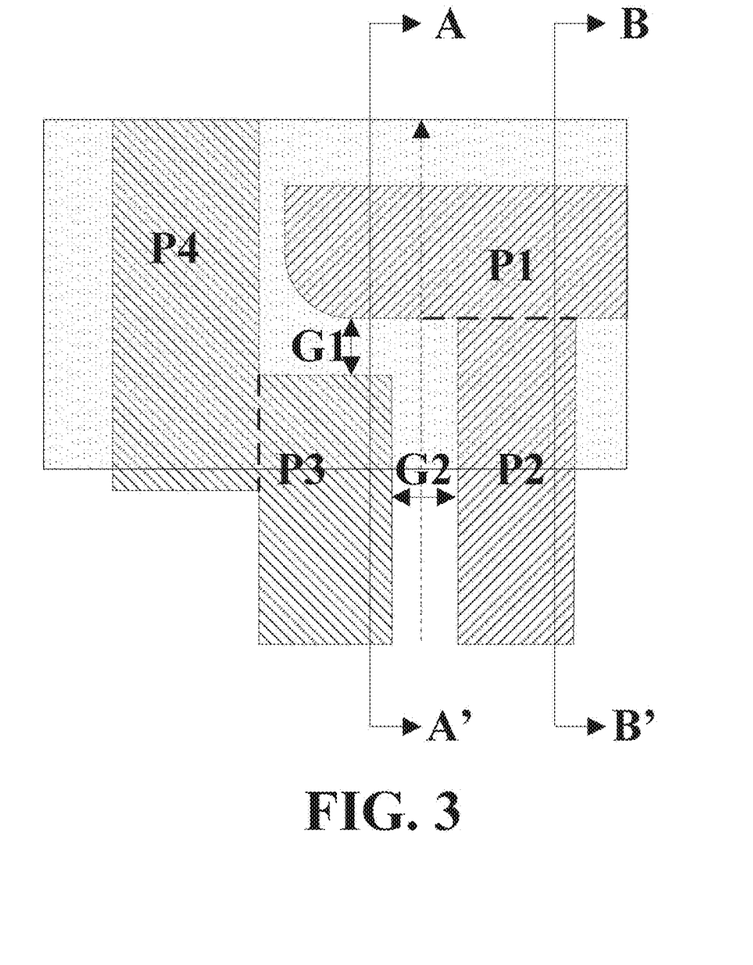
FIG. 3 is a zoom-in view of an area Z in FIG. 1.
Figure 4:
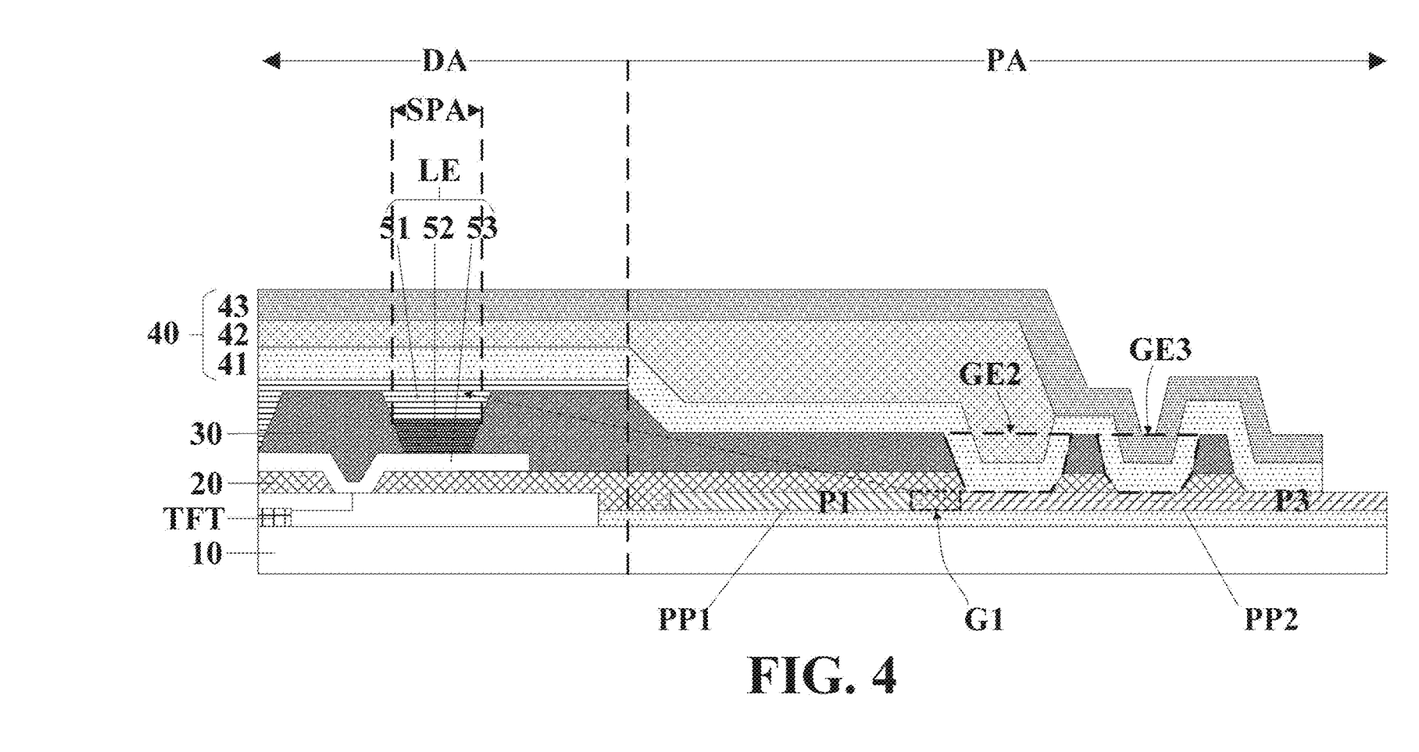
FIG. 4 is a cross-sectional view along an A-A' line of FIG. 3.
Figure 5:
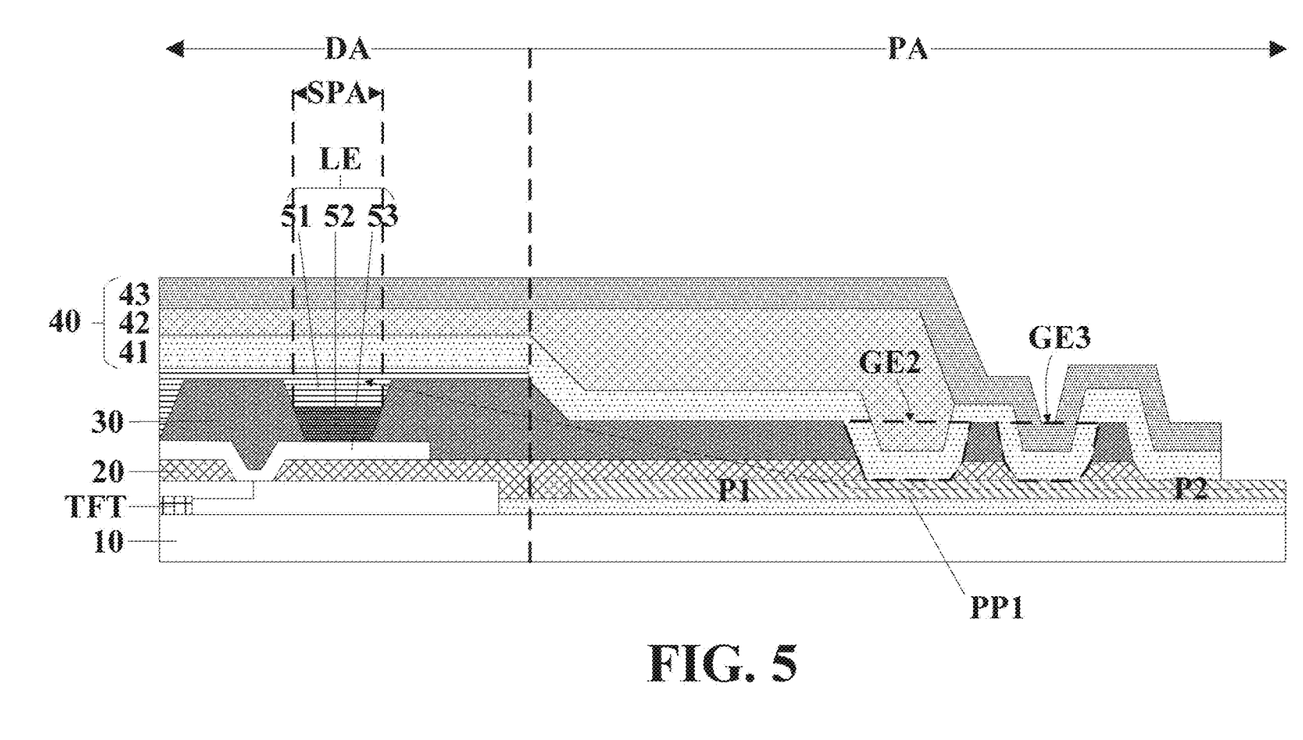
FIG. 5 is a cross-sectional view along a B-B' line of FIG. 3.

FIG. 1 is a plan view of a display substrate in some embodiments according to the present disclosure. FIG. 2 is schematic diagram illustrating the structure of a first power pad in some embodiments according to the present disclosure. FIG. 3 is a zoom-in view of an area Z in FIG. 1. FIG. 4 is a cross-sectional view along an A-A' line of FIG. 3. FIG. 5 is a cross-sectional view along a B-B' line of FIG. 3. Referring to FIGS. 1 to 5, the display substrate in some embodiments have a display area DA and a peripheral area PA. The display substrate includes a base substrate 10; a first power pad PP1 on the base substrate 10; a planarization layer 20 on a side of the first power pad PP1 away from the base substrate 10; a pixel definition layer 30 on aside of the planarization layer 20 away from the base substrate 10, defining a plurality of subpixel apertures SPA; and an encapsulating layer 40 on a side of the pixel definition layer 30 away from the base substrate 10. Optionally, the display substrate further includes a second power pad PP2 on the base substrate 10 and in the peripheral area PA, the second power pad PP2 spaced apart from the first power pad PP1.

In some embodiments, the first power pad PP1 includes a first portion P1 in the peripheral area PA and along a power line interface side of the display substrate, and at least one second portion P2 connected to the first portion P1 and extending from the first portion P1 away from the display area DA. In some embodiments, the second power pad PP2 includes at least one third portion P3 on the power line interface side of the display substrate, and at least one fourth portion P4 connected to the third portion P3 and on another side of the display substrate different from the power line interface side. Optionally, one or a combination of the first portion P1, the at least one second portion P2, the at least one third portion P3, and the at least one fourth portion P4 is at least partially covered by one or a combination of the pixel definition layer 30 and the planarization layer 20. In one example, as shown in FIGS. 1 to 5, one or a combination of the first portion P1, the at least one second portion P2, the at least one third portion P3, and the at least one fourth portion P4 is at least partially covered by both the planarization layer 20 and the pixel definition layer 30. In another example, at least one of the first portion P1, the at least one second portion P2, the at least one third portion P3, and the at least one fourth portion P4 is only at least partially covered by the planarization layer 20 but not the pixel definition layer 30.

Optionally, the power line interface side of the display substrate is an integrated circuit bonding side of the display substrate at which one or more integrated circuits are connected to the display substrate. Optionally, the power line interface side of the display substrate is a side of the display substrate at which one or more power line are connected to the display substrate.

Referring to FIG. 2, in some embodiments, the at least one second portion P2 includes two second portions (one on left and another on right in FIG. 2) connected to the first portion P1 respectively at different locations and extending from the first portion P1 away from the display area DA. Optionally, the first portion P1 and the two second portions of the at least one second portion P2 form a pi-shaped structure.

In some embodiments, and referring to FIG. 4 and FIG. 5, the display substrate further includes a plurality of light emitting elements LE respectively in the plurality of sub-pixel apertures SPA. A respective one of a plurality of light emitting elements LE includes a first electrode 53, a light emitting layer 52 on a side of the first electrode 53 away from the base substrate 10, and a second electrode 51 on a side of the light emitting layer 52 away from the first electrode 53.

In some embodiments, and referring to FIG. 4 and FIG. 5, the display substrate further includes a plurality of thin film transistors TFT for driving light emission of the plurality of light emitting elements LE.

In some embodiments, the first power pad PP1 is connected to and configured to provide a first power signal to a plurality of first power signal lines, and the second power pad PP2 is connected to and configured to provide a second power signal to a plurality of second power signal lines. Optionally, the first power pad PP1 is a VDD power pad connected to a plurality of VDD high voltage power lines, and the second power pad PP2 is a VSS power pad connected to a plurality of VSS low voltage power lines. Optionally, the first power pad PP1 is a VSS power pad connected to a plurality of VSS low voltage power lines, and the second power pad PP2 is a VDD power pad connected to a plurality of VDD high voltage power lines. Optionally, the first power pad and the second power pad may be other pads connected to different signal lines.

In some embodiments, and referring to FIG. 4 and FIG. 5, the encapsulating layer 40 includes a first inorganic encapsulating sub-layer 41 on a side of the plurality light emitting elements LE and the pixel definition layer 30 away from the base substrate 10, an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41.

In some embodiments, and referring to FIG. 4 and FIG. 5, the display substrate has a second groove GE2 extending through one or a combination of the planarization layer 20 and the pixel definition layer 30, exposing a surface of the at least one second portion P2 of the first power pad PP1 in the peripheral area PA and a surface of the at least one third portion P3 of the second power pad PP2 in the peripheral area PA. The encapsulating layer 40 extends into the second groove GE2 and is in direct contact with the surface of the at least one second portion P2 and the surface of the at least one third portion P3. For example, the first inorganic encapsulating sub-layer 41 extends into the second groove GE2 and is in direct contact with the surface of the at least one second portion P2 and the surface of the at least one third portion P3.

In some embodiments, and referring to FIG. 4 and FIG. 5, the display substrate further includes a third groove GE3 extending through one or a combination of the planarization layer 20 and the pixel definition layer 30, exposing a surface of the at least one second portion P2 of the first power pad PP1 in the peripheral area PA and a surface of the at least one third portion P3 of the second power pad PP2 in the peripheral area PA. The encapsulating layer 40 extends into the third groove GE3 and is in direct contact with the surface of the at least one second portion P2 and the surface of the at least one third portion P3. For example, the first inorganic encapsulating sub-layer 41 extends into the third groove GE3 and is in direct contact with the surface of the at least one second portion P2 and the surface of the at least one third portion P3.

Referring to FIG. 3, the at least one third portion P3 is on a side of the first portion P1 extending away from the display area. The first portion P1 and a respective one of the at least one third portion P3 are spaced apart by a first gap G1. The at least one second portion P2 and the at least one third portion P3 are on a side of the first portion P1 extending away from the display area. A respective one of the at least one second portion P2 is spaced apart from a respective one of the at least one third portion P3 by a second gap G2 connected to the first gap G1. The first gap G1 and the second gap G2 form a channel allowing external oxygen and moisture permeate into the inside of the display substrate, because the planarization layer 20 and the pixel definition layer 30 are not capable of completely blocking oxygen and moisture. Referring to the dotted arrow line in FIGS. 3 to 5, the external oxygen and moisture can permeate through the planarization layer 20 and the pixel definition layer 30, and reach the second electrode 51 of the plurality of light emitting elements LE, thereby corroding the second electrode 51, resulting in deterioration of the plurality of light emitting elements LE.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate having a display area and a peripheral area. In some embodiments, the display substrate includes a base substrate; a first power pad on the base substrate, the first power pad including a first portion in the peripheral area and along a power line interface side of the display substrate; a planarization layer on a side of the first power pad away from the base substrate; a pixel definition layer on a side of the planarization layer away from the base substrate, defining a plurality of subpixel apertures; and an encapsulating layer on a side of the pixel definition layer away from the base substrate. Optionally, the display substrate includes a first groove extending through one or a combination of the planarization layer and the pixel definition layer, exposing a surface of the first portion of the first power pad in the peripheral area. Optionally, the encapsulating layer extends into the first groove and is in direct contact with the surface of the first portion, thereby encapsulating the display substrate. Optionally, the encapsulating layer completely covers the surface of the first portion.

Figure 6:
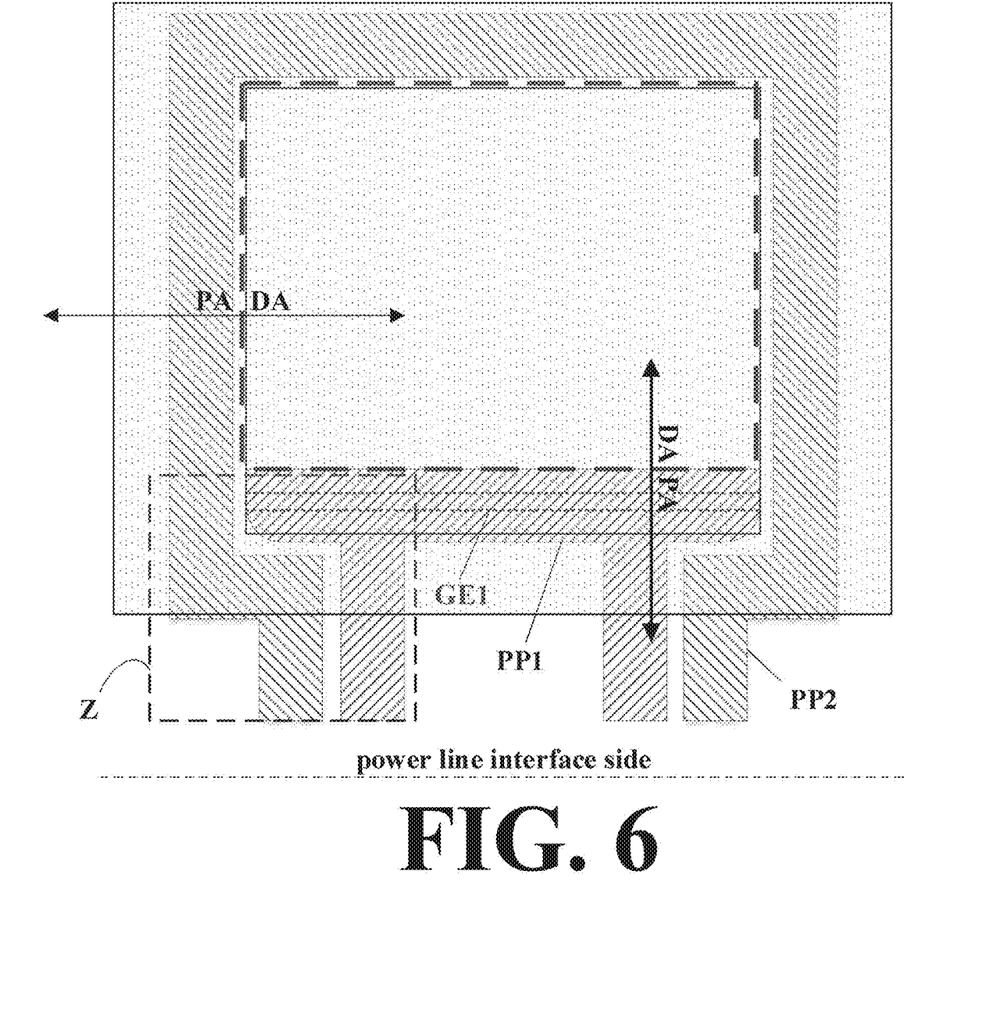
FIG. 6 is a plan view of a display substrate in some embodiments according to the present disclosure.
Figure 7:
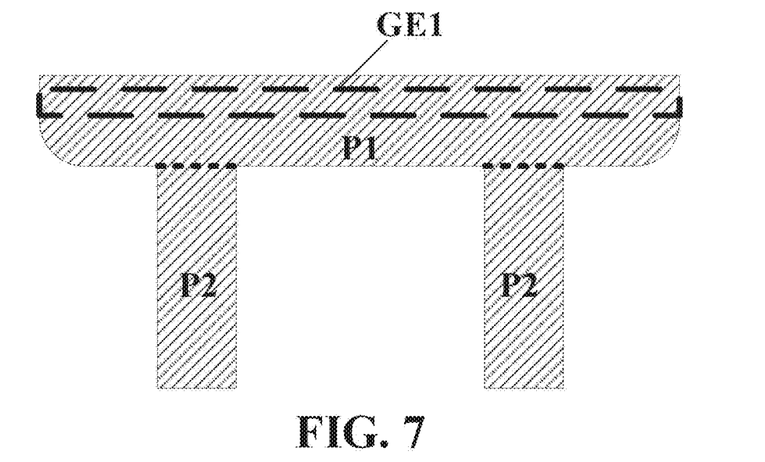
FIG. 7 is schematic diagram illustrating the structure of a first power pad in some embodiments according to the present disclosure.
Figure 8:
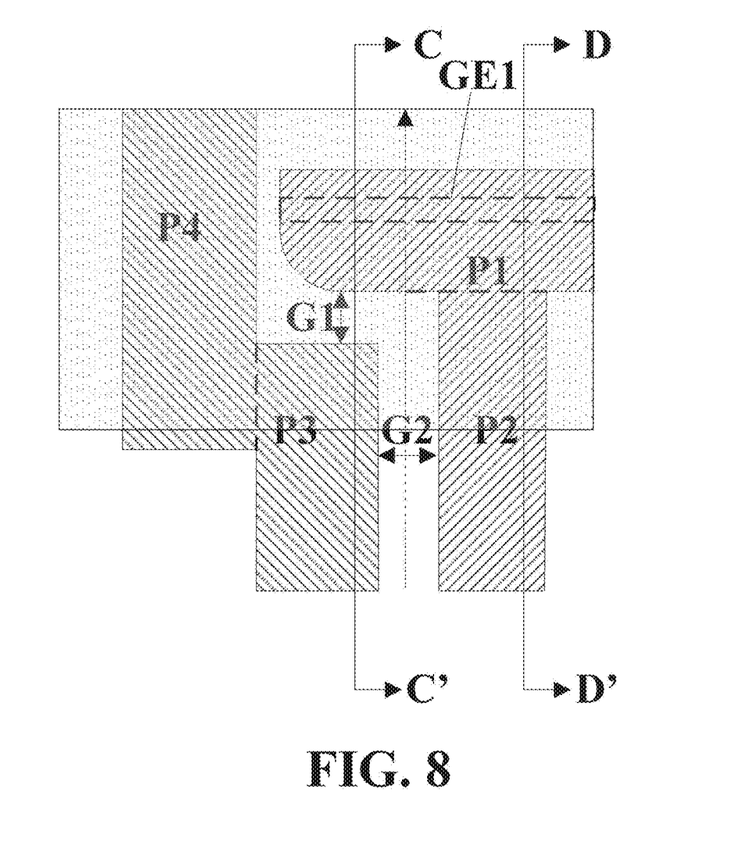
FIG. 8 is a zoom-in view of an area Z in FIG. 6.
Figure 9:
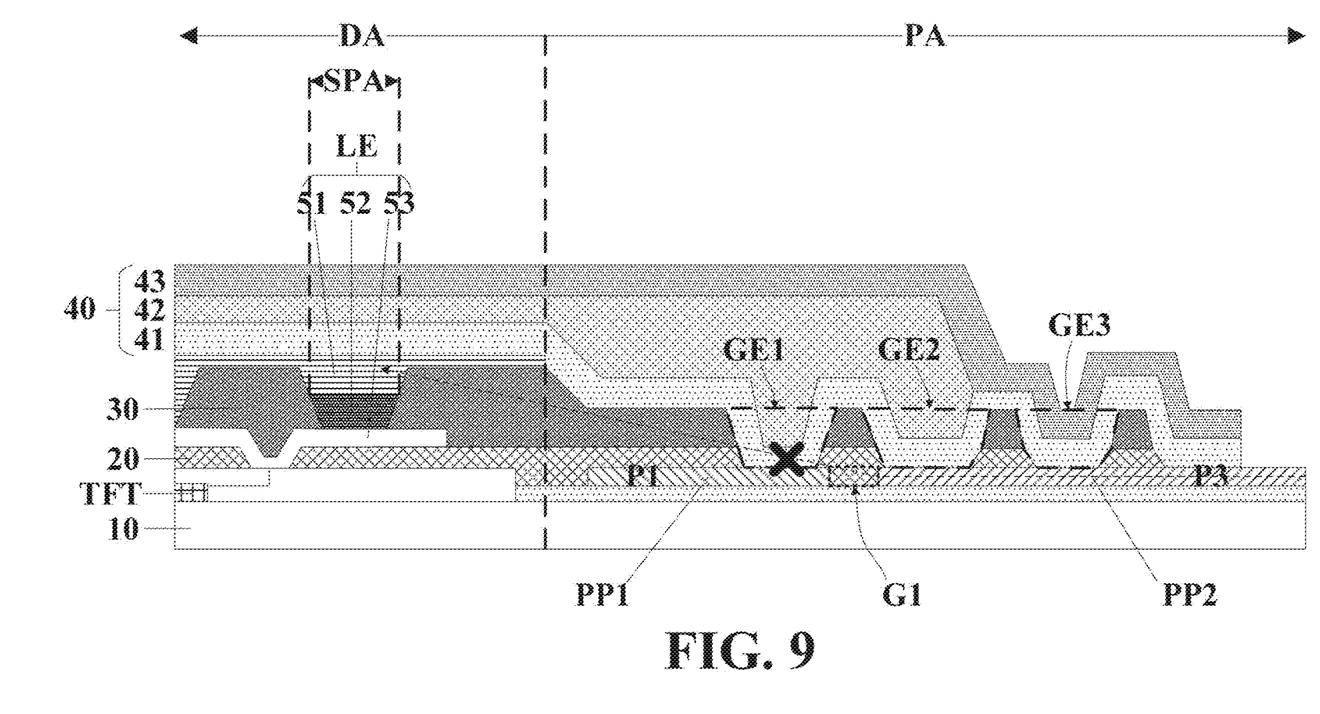
FIG. 9 is a cross-sectional view along a C-C' line of FIG. 8.
Figure 10:
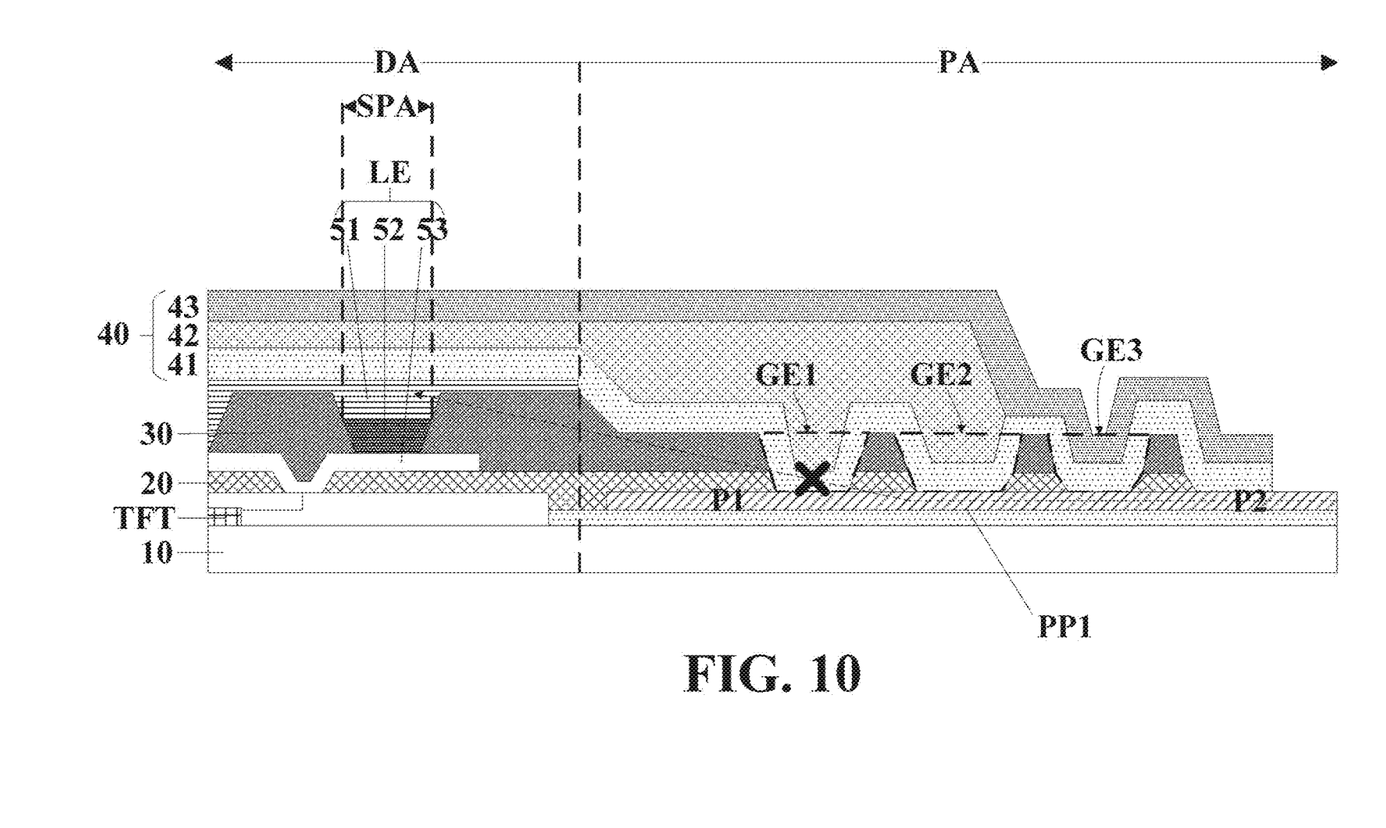
FIG. 10 is a cross-sectional view along a D-D' line of FIG. 8.

FIG. 6 is a plan view of a display substrate in some embodiments according to the present disclosure. FIG. 7 is a schematic diagram illustrating the structure of a first power pad in some embodiments according to the present disclosure. FIG. 8 is a zoom-in view of an area Z in FIG. 6. FIG. 9 is a cross-sectional view along a C-C' line of FIG. 8. FIG. 10 is a cross-sectional view along a D-D' line of FIG. 8. Referring to FIGS. 6 to 10, the display substrate in some embodiments have a display area DA and a peripheral area PA. The display substrate includes a base substrate 10; a first power pad PP1 on the base substrate 10; a planarization layer 20 on a side of the first power pad PP1 away from the base substrate 10; a pixel definition layer 30 on a side of the planarization layer 20 away from the base substrate 10, defining a plurality of subpixel apertures SPA; and an encapsulating layer 40 on a side of the pixel definition layer 30 away from the base substrate 10. In some embodiments, the first power pad PP1 includes a first portion P1 in the peripheral area PA and along a power line interface side of the display substrate. Optionally, the display substrate has a first groove GE1 extending through one or a combination of the planarization layer 20 and the pixel definition layer 30, exposing a surface of the first portion P1 of the first power pad PP1 in the peripheral area PA. In one example, and referring to FIG. 9 and FIG. 10, the first groove GE1 extends through both of the planarization layer 20 and the pixel definition layer 30, exposing the surface of the first portion P1 of the first power pad PP1 in the peripheral area PA. The encapsulating layer 40 extends into the first groove GE1 and is in direct contact with the surface of the first portion P1, thereby encapsulating the display substrate. The encapsulating layer 40 completely covers the surface of the first portion P1.

In some embodiments, the display substrate further includes a second power pad PP2 on the base substrate 10 and in the peripheral area PA, the second power pad PP2 spaced apart from the first power pad PP1. In some embodiments, the first power pad PP1 is connected to and configured to provide a first power signal to a plurality of first power signal lines, and the second power pad PP2 is connected to and configured to provide a second power signal to a plurality of second power signal lines. Optionally, the first power pad is a VDD power pad connected to a plurality of VDD high voltage power lines, and the second power pad is a VSS power pad connected to a plurality of VSS low voltage power lines. Optionally, the first power pad is a VSS power pad connected to a plurality of VSS low voltage power lines, and the second power pad is a VDD power pad connected to a plurality of VDD high voltage power lines. Optionally, the first power pad and the second power pad may be other pads connected to different signal lines.

Optionally, referring to FIG. 6, the first power pad PP1 (e.g., the VDD power pad) is disposed along one side of the display substrate, and the second power pad PP2 (e.g., the VSS power pad) substantially surround at least three sides of the display substrate, and extends out of the display substrate from a circuit bonding side (e.g., the power line interface side) of the display substrate.

In some embodiments, and referring to FIG. 9 and FIG. 10, the display substrate further includes a plurality of light emitting elements LE respectively in the plurality of subpixel apertures SPA. A respective one of a plurality of light emitting elements LE includes a first electrode 53, a light emitting layer 52 on a side of the first electrode 53 away from the base substrate 10, and a second electrode 51 on a side of the light emitting layer 52 away from the first electrode 53.

In some embodiments, and referring to FIG. 9 and FIG. 10, the display substrate further includes a plurality of thin film transistors TFT for driving light emission of the plurality of light emitting elements LE. In one example, the first electrode 53 is electrically connected to a drain electrode of a respective one of the plurality of thin film transistors TFT. The plurality of thin film transistors TFT and various signal lines (such as the plurality of VDD high voltage power lines and the plurality of VSS low voltage power lines) constitute a driving circuit for driving light emission of the display substrate.

Figure 11:
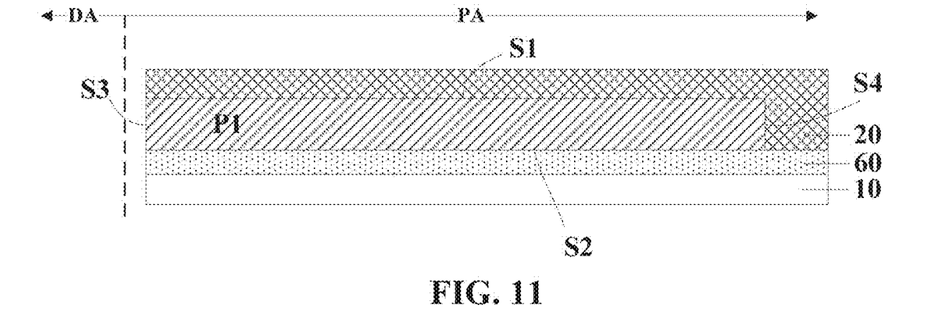
FIG. 11 is a partial view of a display substrate showing the structure of a first portion of a first power pad in some embodiments according to the present disclosure.

FIG. 11 is a partial view of a display substrate showing the structure of a first portion of a first power pad in some embodiments according to the present disclosure. Referring to FIG. 11, the first portion P1 has a first side S1 away from the base substrate 10, a second side S2 opposite to the first side S1 and closer to the base substrate 10, a third side S3 connecting the first side S1 and the second side S2 and closer to the display area DA, and a fourth side S4 connecting the first side S1 and the second side S2, the fourth side S4 being opposite to the third side S3 and away from the display area DA. Optionally, the fourth side S4 of the first portion P1 is covered by one or a combination of the pixel definition layer 30 and the planarization layer 20. In one example, the fourth side S4 of the first portion P1 is covered by the planarization layer 20, as shown in FIG. 11 and FIG. 9. Optionally, the first groove GE1 exposes a portion of the first side S1, as shown in FIG. 9 and FIG. 10. Optionally, the display substrate further includes an inter-layer dielectric layer 60 between the first portion P1 and the base substrate 10.

Figure 12:
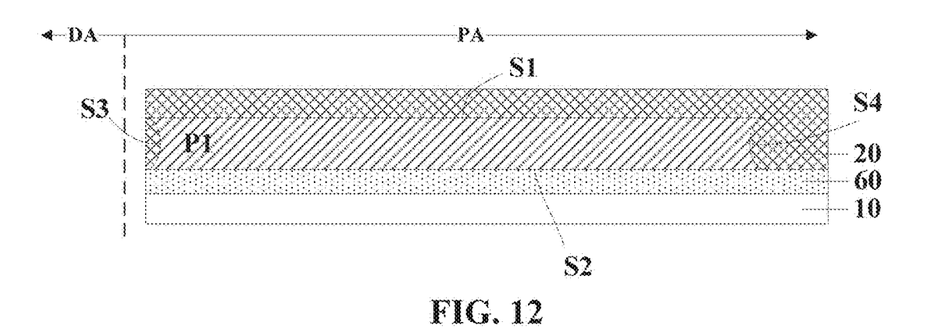
FIG. 12 is a partial view of a display substrate showing the structure of a first portion of a first power pad in some embodiments according to the present disclosure.

FIG. 12 is a partial view of a display substrate showing the structure of a first portion of a first power pad in some embodiments according to the present disclosure. Referring to FIG. 12, in some embodiments, the third side S3 has a concave surface, and the fourth side S4 has a concave surface.

Figure 13:
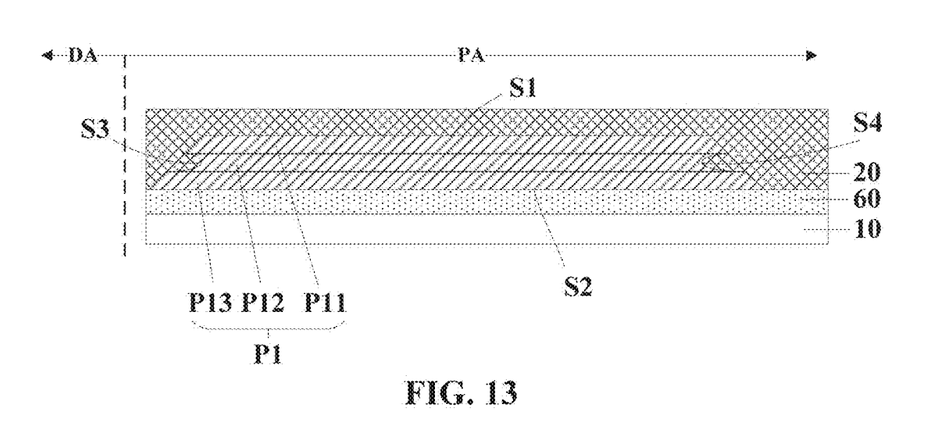
FIG. 13 is a partial view of a display substrate showing the structure of a first portion of a first power pad in some embodiments according to the present disclosure.

In some embodiments, the first portion P1 includes at least one sublayer that is over-etched on the fourth side S4, thereby forming the concave surface. FIG. 13 is a partial view of a display substrate showing the structure of a first portion of a first power pad in some embodiments according to the present disclosure. Referring to FIG. 13, in some embodiments, the first portion P1 includes a first sub-layer P11, a second sub-layer P12 in the middle, and a third sub-layer P13, the second sub-layer P12 is sandwiched by the first sub-layer P11 and the third sub-layer P13. At least the second sub-layer P12 is over-etched, thereby forming the concave surface.

Optionally, the first sub-layer P11 and the third sub-layer P13 are made of a relatively more etchant resistant material, and the second sub-layer P12 is made of a relatively less etchant resistant material. In one example, the first sub-layer P11 and the third sub-layer P13 are made of titanium, and the second sub-layer P12 is made of aluminum.

The second portion P2 and the second power pad PP2 may have a similar concave surface. Optionally, the first power pad PP1 and the second power pad PP2 are made of a same material, and fabricated in a same patterning process and using a single mask plate. Optionally, each of the first power pad PP1 and the second power pad PP2 includes a plurality of sub-layers (e.g., a first sub-layer P11, a second sub-layer P12, and a third sub-layer P13).

In the fabricating process of the display substrate, the first power pad PP1 and the second power pad PP2 (e.g., the first portion P1) are first formed and patterned on the base substrate 10. A planarization layer 20 is formed on the first power pad PP1 and the second power pad PP2 (e.g., the first portion P1), and subsequently the first electrode 53 is formed by depositing a conductive material layer followed by etching the conductive material layer to form the pattern of the first electrode 53. In the process of etching the conductive material layer, a side surface of the first portion P1 (or any other portion of the first power pad PP1 or the second power pad PP2) that is not covered by the planarization layer 20 can be etched by the etchant for etching the conductive material layer. In one example, one of the sub-layers of the first portion P1 is made of a relatively less etchant resistant material, and is over-etched during the etching process, thereby forming a concave side surface. Subsequently, the pixel definition layer 30 is formed on the base substrate 10, the pixel definition material of the pixel definition layer 30 fills in the concave surface. When the encapsulating layer 40 is formed to encapsulate the display substrate, it cannot completely encapsulate the concave surface. As discussed previously, the pixel definition layer 30 and the planarization layer 20 are not capable of completely blocking oxygen and moisture. External oxygen and moisture can permeate through the planarization layer 20 and the pixel definition layer 30.

However, referring to FIG. 9 and FIG. 10, due to the formation of the first groove GE1, the encapsulating layer 40 extends into the first groove GE1 and is in direct contact with the first side S1 of the first portion P1 (see, e.g., FIGS. 11 to 13). As shown in FIG. 9 and FIG. 10, the presence of the encapsulating layer 40 in this region blocks the pathway of external oxygen and moisture to reach the second electrode 51. As a result, the second electrode 51 is protected from corrosion caused by the external oxygen and moisture permeating through the first gap G1 and the second gap G2 (see, e.g., FIG. 8). The performance and lifetime of the plurality of light emitting elements LE are significantly enhanced.

In some embodiments, and referring to FIG. 9 and FIG. 10, the encapsulating layer 40 includes a first inorganic encapsulating sub-layer 41 on a side of the plurality light emitting elements LE and the pixel definition layer 30 away from the base substrate 10, an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41. Optionally, the first inorganic encapsulating sub-layer 41 extends into the first groove GE1 and is in direct contact with the surface of the first portion P1 (e.g., the first side S1 of the first portion P1 as shown in FIGS. 11 to 13). Optionally, in a region corresponding to the first groove GE1, the encapsulating layer 40 further includes an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41.

Referring to FIG. 8 and FIG. 10, in some embodiments, the first power pad PP includes a first portion P1 in the peripheral area PA and along a power line interface side of the display substrate, and at least one second portion P2 connected to the first portion P1 and extending from the first portion P1 away from the display area DA. Optionally, the at least one second portion P2 is at least partially covered by one or a combination of the pixel definition layer 30 and the planarization layer 20. Referring to FIG. 7, in some embodiments, the at least one second portion P2 includes two second portions (one on left and another on right in FIG. 7) connected to the first portion P1 respectively at different locations and extending from the first portion P1 away from the display area DA. Optionally, the first portion P1 and the two second portions of the at least one second portion P2 form a pi-shaped structure.

In some embodiments, and referring to FIG. 10, the display substrate has a second groove GE2 extending through one or a combination of the planarization layer 20 and the pixel definition layer 30, exposing a surface of the at least one second portion P2 of the first power pad PP1 in the peripheral area PA. The encapsulating layer 40 extends into the second groove GE2 and is in direct contact with the surface of the at least one second portion P2. For example, the first inorganic encapsulating sub-layer 41 extends into the second groove GE2 and is in direct contact with the surface of the at least one second portion P2.

Optionally, in a region corresponding to the second groove GE2, the encapsulating layer 40 further includes an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41.

Optionally, in a region corresponding to the second groove GE2, the encapsulating layer 40 further includes a second inorganic encapsulating sub-layer 43 on a side of the first inorganic encapsulating sub-layer 41 away from the base substrate 10. In one example, in a region corresponding to the second groove GE2, the organic encapsulating sub-layer 42 is not present.

In some embodiments, and referring to FIG. 9, the second power pad PP2 includes at least one third portion P3 on the power line interface side of the display substrate. The at least one third portion P3 is at least partially covered by one or a combination of the pixel definition layer 30 and the planarization layer 20. In some embodiments, the display substrate has a second groove GE2 extending through one or a combination of the planarization layer 20 and the pixel definition layer 30, exposing a surface of the at least one third portion P3 of the second power pad PP2 in the peripheral area PA. The encapsulating layer 40 extends into the second groove GE2 and is in direct contact with the surface of the at least one third portion P3. For example, the first inorganic encapsulating sub-layer 41 extends into the second groove GE2 and is in direct contact with the surface of the at least one third portion P3. Optionally, in a region corresponding to the second groove GE2, the encapsulating layer 40 further includes an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41.

In some embodiments, and referring to FIG. 9 and FIG. 10, the display substrate has a second groove GE2 extending through one or a combination of the planarization layer 20 and the pixel definition layer 30, exposing a surface of the at least one second portion P2 of the first power pad PP1 in the peripheral area PA and a surface of the at least one third portion P3 of the second power pad PP2 in the peripheral area PA. The encapsulating layer 40 extends into the second groove GE2 and is in direct contact with the surface of the at least one second portion P2 and the surface of the at least one third portion P3. For example, the first inorganic encapsulating sub-layer 41 extends into the second groove GE2 and is in direct contact with the surface of the at least one second portion P2 and the surface of the at least one third portion P3.

Optionally, in a region corresponding to the second groove GE2, the encapsulating layer 40 further includes an organic encapsulating sub-layer 42 on a side of the first inorganic encapsulating sub-layer 41 away from the base substrate 10, and a second inorganic encapsulating sub-layer 43 on a side of the organic encapsulating sub-layer 42 away from the first inorganic encapsulating sub-layer 41.

Optionally, in a region corresponding to the second groove GE2, the encapsulating layer 40 further includes a second inorganic encapsulating sub-layer 43 on a side of the first inorganic encapsulating sub-layer 41 away from the base substrate 10. In one example, in a region corresponding to the second groove GE2, the organic encapsulating sub-layer 42 is not present.

In some embodiments, and referring to FIG. 10, the display substrate has a third groove GE3 extending through one or a combination of the planarization layer 20 and the pixel definition layer 30, exposing a surface of the at least one second portion P2 of the first power pad PP1 in the peripheral area PA. The encapsulating layer 40 extends into the third groove GE3 and is in direct contact with the surface of the at least one second portion P2. For example, the first inorganic encapsulating sub-layer 41 extends into the third groove GE3 and is in direct contact with the surface of the at least one second portion P2. Optionally, in a region corresponding to the third groove GE3, the encapsulating layer 40 further includes a second inorganic encapsulating sub-layer 43 on a side of the first inorganic encapsulating sub-layer 41 away from the base substrate 10. In one example, in a region corresponding to the third groove GE3, the organic encapsulating sub-layer 42 is not present.

In some embodiments, and referring to FIG. 9, the display substrate has a third groove GE3 extending through one or a combination of the planarization layer 20 and the pixel definition layer 30, exposing and a surface of the at least one third portion P3 of the second power pad PP2 in the peripheral area PA. The encapsulating layer 40 extends into the third groove GE3 and is in direct contact with the surface of the at least one third portion P3. For example, the first inorganic encapsulating sub-layer 41 extends into the third groove GE3 and is in direct contact with the surface of the at least one third portion P3. Optionally, in a region corresponding to the third groove GE3, the encapsulating layer 40 further includes a second inorganic encapsulating sub-layer 43 on a side of the first inorganic encapsulating sub-layer 41 away from the base substrate 10. In one example, in a region corresponding to the third groove GE3, the organic encapsulating sub-layer 42 is not present.

In some embodiments, and referring to FIG. 9 and FIG. 10, the display substrate has a third groove GE3 extending through one or a combination of the planarization layer 20 and the pixel definition layer 30, exposing a surface of the at least one second portion P2 of the first power pad PP1 in the peripheral area PA and a surface of the at least one third portion P3 of the second power pad PP2 in the peripheral area PA. The encapsulating layer 40 extends into the third groove GE3 and is in direct contact with the surface of the at least one second portion P2 and the surface of the at least one third portion P3. For example, the first inorganic encapsulating sub-layer 41 extends into the third groove GE3 and is in direct contact with the surface of the at least one second portion P2 and the surface of the at least one third portion P3. Optionally, in a region corresponding to the third groove GE3, the encapsulating layer 40 further includes a second inorganic encapsulating sub-layer 43 on a side of the first inorganic encapsulating sub-layer 41 away from the base substrate 10. In one example, in a region corresponding to the third groove GE3, the organic encapsulating sub-layer 42 is not present.

Referring to FIGS. 8 to 10, in some embodiments, the at least one third portion P3 is on a side of the first portion P1 extending away from the display area. The first portion P1 and a respective one of the at least one third portion P3 are spaced apart by a first gap G. The first groove GE1 is on a side of the first gap G1 closer to the display area DA. Optionally, the planarization layer 20 extends into the first gap G1. In some embodiments, the at least one second portion P2 and the at least one third portion P3 are on a side of the first portion P1 extending away from the display area. A respective one of the at least one second portion P2 is spaced apart from a respective one of the at least one third portion P3 by a second gap G2 connected to the first gap G. Optionally, the planarization layer 20 extends into the first gap G1 and the second gap G2.

Various appropriate light emitting elements may be used in the present display substrate. Examples of appropriate light emitting elements include organic light emitting diodes, quantum dots light emitting diodes, and micro light emitting diodes.

In another aspect, the present disclosure provides a display apparatus including a display substrate described herein or fabricated by a method described herein, and one or more integrated circuits connected to the display substrate. Optionally, the display apparatus includes a display panel. Optionally, the display panel includes the display substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc. Optionally, the stretchable display apparatus further includes one or more integrated circuits connected to the stretchable display panel.

In another aspect, the present disclosure provides a method of fabricating a display substrate. In some embodiments, the method includes forming a first power pad on a base substrate, the first power pad formed to include a first portion in the peripheral area and along a power line interface side of the display substrate; forming a planarization layer on a side of the first power pad away from the base substrate; forming a pixel definition layer on a side of the planarization layer away from the base substrate, defining a plurality of subpixel apertures; forming a first groove extending through one or a combination of the planarization layer and the pixel definition layer, exposing a surface of the first portion of the first power pad in the peripheral area; and forming an encapsulating layer on a side of the pixel definition layer away from the base substrate, the encapsulating layer formed to extend into the first groove and be in direct contact with the surface of the first portion, thereby encapsulating the display substrate.

In some embodiments, the first portion is formed to have a first side away from the base substrate, a second side opposite to the first side and closer to the base substrate, a third side connecting the first side and the second side and closer to the display area, and a fourth side connecting the first side and the second side, the fourth side being opposite to the third side and away from the display area. Optionally, the fourth side of the first portion is formed to be covered by one or a combination of the pixel definition layer and the planarization layer. The first groove is formed to expose a portion of the first side. Optionally, the first portion is formed so that the fourth side has a concave surface. Optionally, the first portion is formed to include a plurality of sub-layers, at least one of which is over-etched on the fourth side, thereby forming the concave surface.

In some embodiments, forming the encapsulating layer includes forming a first inorganic encapsulating sub-layer on a side of the plurality light emitting elements and the pixel definition layer away from the base substrate, forming an organic encapsulating sub-layer on a side of the first inorganic encapsulating sub-layer away from the base substrate, and forming a second inorganic encapsulating sub-layer on a side of the organic encapsulating sub-layer away from the first inorganic encapsulating sub-layer. Optionally, the first inorganic encapsulating sub-layer is formed to extend into the first groove and be in direct contact with the surface of the first portion. Optionally, in a region corresponding to the first groove, the organic encapsulating sub-layer is formed on a side of the first inorganic encapsulating sub-layer away from the base substrate, and a second inorganic encapsulating sub-layer is formed on a side of the organic encapsulating sub-layer away from the first inorganic encapsulating sub-layer.

In some embodiments, forming the first power pad further includes forming at least one second portion connected to the first portion and extending from the first portion away from the display area. Optionally, one or a combination of the pixel definition layer and the planarization layer is formed to at least partially cover the at least one second portion. Optionally, the method further includes forming a second groove extending through one or a combination of the planarization layer and the pixel definition layer, exposing a surface of the at least one second portion of the first power pad in the peripheral area. Optionally, the encapsulating layer is formed to extend into the second groove and be in direct contact with the surface of the at least one second portion. Optionally, the first inorganic encapsulating sub-layer is formed to extend into the second groove and be in direct contact with the surface of the at least one second portion. Optionally, in a region corresponding to the second groove, an organic encapsulating sub-layer is formed on a side of the first inorganic encapsulating sub-layer away from the base substrate, and a second inorganic encapsulating sub-layer is formed on a side of the organic encapsulating sub-layer away from the first inorganic encapsulating sub-layer.

In some embodiments, forming the at least one second portion includes forming two second portions connected to the first portion respectively at different locations and extending from the first portion away from the display area. Optionally, the first portion and the two second portions are formed to have a pi-shaped structure.

In some embodiments, the method further includes forming a second power pad on the base substrate and in the peripheral area, the second power pad formed to be spaced apart from the first power pad. Optionally, forming the second power pad includes forming at least one third portion on the power line interface side of the display substrate. Optionally, one or a combination of the pixel definition layer and the planarization layer is formed to at least partially cover the at least one third portion. Optionally, the second groove is formed to extend through one or a combination of the planarization layer and the pixel definition layer, further exposing a surface of the at least one third portion of the second power pad in the peripheral area. Optionally, the encapsulating layer is formed to extend into the second groove and be in direct contact with the surface of the at least one third portion.

In some embodiments, the first portion and a respective one of the at least one third portion are formed to be spaced apart by a first gap. Optionally, the first groove is formed on a side of the first gap closer to the display area. Optionally, the planarization layer is formed to extend into the first gap. Optionally, the at least one second portion and the at least one third portion are formed so that a respective one of the at least one second portion is spaced apart from a respective one of the at least one third portion by a second gap connected to the first gap. Optionally, the planarization layer is formed to extend into the first gap and the second gap.

In some embodiments, the method further includes forming a third groove extending through one or a combination of the planarization layer and the pixel definition layer, exposing a surface of the at least one second portion of the first power pad in the peripheral area. Optionally, the first inorganic encapsulating sub-layer is formed to extend into the third groove and is formed to be in direct contact with the surface of the at least one second portion. Optionally, in a region corresponding to the third groove, a second inorganic encapsulating sub-layer is formed on a side of the first inorganic encapsulating sub-layer away from the base substrate, the second inorganic encapsulating sub-layer is formed to be in direct contact with the first inorganic encapsulating sub-layer.

Optionally, the third groove is formed to expose a surface of the at least one third portion of the second power pad in the peripheral area. Optionally, the first inorganic encapsulating sub-layer is formed to extend into the third groove and is formed to be in direct contact with the surface of the at least one third portion. Optionally, in a region corresponding to the third groove, a second inorganic encapsulating sub-layer is formed on a side of the first inorganic encapsulating sub-layer away from the base substrate, the second inorganic encapsulating sub-layer is formed to be in direct contact with the first inorganic encapsulating sub-layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a display area and a peripheral area, comprising:
 a base substrate;
 a first power pad on the base substrate, the first power pad comprising a first portion in the peripheral area and along a power line interface side of the display substrate;
 a planarization layer on a side of the first power pad away from the base substrate;
 a pixel definition layer on a side of the planarization layer away from the base substrate, defining a plurality of subpixel apertures; and
 an encapsulating layer on a side of the pixel definition layer away from the base substrate;
 wherein the display substrate comprises a first groove extending through one or a combination of the planarization layer and the pixel definition layer, exposing a surface of the first portion of the first power pad in the peripheral area; and
 a sub-layer of the encapsulating layer extends from the display area into the first groove and is in direct contact with the surface of the first portion, thereby encapsulating the display substrate.

2. The display substrate of claim 1, further comprising a plurality of light emitting elements in the display area;
 wherein the sub-layer of the encapsulating layer that extends from the display area into the first groove and is in direct contact with the surface of the first portion is on a side of the plurality of light emitting elements away from the base substrate; and
 an orthographic projection of the sub-layer on the base substrate covers orthographic projections of the plurality of light emitting elements on the base substrate.

3. The display substrate of claim 1, wherein the first portion comprises a first side away from the base substrate, a second side opposite to the first side and closer to the base substrate, a third side connecting the first side and the second side and closer to the display area, and a fourth side connecting the first side and the second side, the fourth side being opposite to the third side and away from the display area;
 the fourth side of the first portion is covered by one or a combination of the pixel definition layer and the planarization layer; and
 the first groove exposes a portion of the first side.

4. The display substrate of claim 3, wherein the fourth side has a concave surface with a degree of curvature greater than zero.

5. The display substrate of claim 4, wherein the first portion comprises at least one sublayer that is over-etched on the fourth side, thereby forming the concave surface.

6. The display substrate of claim 1, wherein the encapsulating layer comprises a first inorganic encapsulating sub-layer, the first inorganic encapsulating sub-layer is the sub-layer of the encapsulating layer that extends from the display area into the first groove and is in direct contact with the surface of the first portion; and
 an orthographic projection of the first inorganic encapsulating sub-layer on the base substrate covers an orthographic projection of the first portion on the base substrate.

7. The display substrate of claim 6, wherein, in a region corresponding to the first groove, the encapsulating layer further comprises an organic encapsulating sub-layer on a side of the first inorganic encapsulating sub-layer away from the base substrate, and a second inorganic encapsulating sub-layer on a side of the organic encapsulating sub-layer away from the first inorganic encapsulating sub-layer.

8. The display substrate of claim 1, wherein the first power pad further comprises at least one second portion connected to the first portion and extending from the first portion away from the display area; and
 the at least one second portion is at least partially covered by one or a combination of the pixel definition layer and the planarization layer.

9. The display substrate of claim 8, wherein the display substrate further comprises a second groove extending through one or a combination of the planarization layer and the pixel definition layer, exposing a surface of the at least one second portion of the first power pad in the peripheral area; and
 the sub-layer of the encapsulating layer extends from the display area into the second groove and is in direct contact with the surface of the at least one second portion.

10. The display substrate of claim 9, wherein the encapsulating layer comprises a first inorganic encapsulating sub-layer, the first inorganic encapsulating sub-layer is the sub-layer of the encapsulating layer that extends from the display area into the second groove and is in direct contact with the surface of the at least one second portion.

11. The display substrate of claim 10, wherein, in a region corresponding to the second groove, the encapsulating layer further comprises an organic encapsulating sub-layer on a side of the first inorganic encapsulating sub-layer away from the base substrate, and a second inorganic encapsulating sub-layer on a side of the organic encapsulating sub-layer away from the first inorganic encapsulating sub-layer; and
 an orthographic projection of the organic encapsulating sub-layer on the base substrate at least partially overlaps with an orthographic projection of the second groove on the base substrate.

12. The display substrate of claim 9, further comprising a second power pad on the base substrate and in the peripheral area, the second power pad spaced apart from the first power pad;
 wherein the second power pad comprises at least one third portion on the power line interface side of the display substrate, the at least one third portion at least partially covered by one or a combination of the pixel definition layer and the planarization layer;
 the second groove extends through one or a combination of the planarization layer and the pixel definition layer, further exposing a surface of the at least one third portion of the second power pad in the peripheral area; and
 the sub-layer of the encapsulating layer extends from the display area into the second groove and is in direct contact with the surface of the at least one third portion.

13. The display substrate of claim 8, wherein the at least one second portion comprises two second portions connected to the first portion respectively at different locations and extending from the first portion away from the display area; and the first portion and the two second portions form a pi-shaped structure.

14. The display substrate of claim 8, the display substrate further comprises a third groove extending through one or a combination of the planarization layer and the pixel definition layer, exposing a surface of the at least one second portion of the first power pad in the peripheral area;
the encapsulating layer comprises a first inorganic encapsulating sub-layer, the first inorganic encapsulating sub-layer extending into the third groove and being in direct contact with the surface of the at least one second portion;
in a region corresponding to the third groove, the encapsulating layer further comprises a second inorganic encapsulating sub-layer on a side of the first inorganic encapsulating sub-layer away from the base substrate, the second inorganic encapsulating sub-layer being in direct contact with the first inorganic encapsulating sub-layer.

15. The display substrate of claim 1, further comprising a second power pad on the base substrate and in the peripheral area, the second power pad spaced apart from the first power pad;
wherein the second power pad comprises at least one third portion on the power line interface side of the display substrate, the at least one third portion at least partially covered by one or a combination of the pixel definition layer and the planarization layer;
the at least one third portion is on a side of the first portion extending away from the display area, the first portion and a respective one of the at least one third portion being spaced apart by a first gap; and
the first groove is on a side of the first gap closer to the display area.

16. The display substrate of claim 15, wherein the planarization layer at least extends into the first gap.

17. The display substrate of claim 15, wherein the first power pad further comprises at least one second portion connected to the first portion and extending from the first portion away from the display area;
the at least one second portion is at least partially covered by one or a combination of the pixel definition layer and the planarization layer; and
the at least one second portion and the at least one third portion are on a side of the first portion extending away from the display area, a respective one of the at least one second portion being spaced apart from a respective one of the at least one third portion by a second gap connected to the first gap.

18. The display substrate of claim 1, wherein the first power pad is selected from a group consisting of a VDD power pad connected to a plurality of VDD high voltage power lines and a VSS power pad connected to a plurality of VSS low voltage power lines.

19. A display apparatus, comprising the display substrate of claim 1, and one or more integrated circuits connected to the display substrate.

20. A method of fabricating a display substrate, comprising:
forming a first power pad on a base substrate, the first power pad formed to comprise a first portion in the peripheral area and along a power line interface side of the display substrate;
forming a planarization layer on a side of the first power pad away from the base substrate;
forming a pixel definition layer on a side of the planarization layer away from the base substrate, defining a plurality of subpixel apertures;
forming a first groove extending through one or a combination of the planarization layer and the pixel definition layer, exposing a surface of the first portion of the first power pad in the peripheral area; and
forming an encapsulating layer on a side of the pixel definition layer away from the base substrate, a sub-layer of the encapsulating layer being formed to extend from the display area into the first groove and be in direct contact with the surface of the first portion, thereby encapsulating the display substrate.

* * * * *